United States Patent
Andino

(10) Patent No.: US 8,095,588 B2
(45) Date of Patent: Jan. 10, 2012

(54) METHOD AND SYSTEM FOR DATA DECOMPOSITION VIA GRAPHICAL MULTIVARIATE ANALYSIS

(75) Inventor: Ramon Jaime Andino, Cambridge, MA (US)

(73) Assignee: General Electric Company, Schenectady, NY (US)

( * ) Notice: Subject to any disclaimer, the term of this patent is extended or adjusted under 35 U.S.C. 154(b) by 1046 days.

(21) Appl. No.: 11/967,433

(22) Filed: Dec. 31, 2007

(65) Prior Publication Data

US 2009/0172071 A1    Jul. 2, 2009

(51) Int. Cl.
*G06G 7/12* (2006.01)
(52) U.S. Cl. .................................... 708/806
(58) Field of Classification Search ............. 708/806, 708/443, 444, 446
See application file for complete search history.

(56) References Cited

U.S. PATENT DOCUMENTS

| | | | |
|---|---|---|---|
| 4,967,381 A | | 10/1990 | Lane et al. |
| 5,442,562 A | | 8/1995 | Hopkins et al. |
| 5,691,895 A | * | 11/1997 | Kurtzberg et al. ............. 700/29 |
| 5,691,906 A | | 11/1997 | Togashi et al. |
| 5,710,700 A | * | 1/1998 | Kurtzberg et al. ............. 700/29 |
| 5,841,676 A | | 11/1998 | Ali et al. |
| 7,457,732 B2 | * | 11/2008 | Aragones et al. ................ 703/2 |
| 2003/0195718 A1 | * | 10/2003 | Crowder, Jr. ................ 702/183 |
| 2004/0083452 A1 | * | 4/2004 | Minor et al. .................. 717/109 |
| 2007/0005266 A1 | * | 1/2007 | Blevins et al. .................. 702/22 |
| 2010/0036529 A1 | * | 2/2010 | Landells et al. .............. 700/270 |

* cited by examiner

*Primary Examiner* — Tan V Mai
(74) *Attorney, Agent, or Firm* — David J. Clement, Esq.; Armstrong Teasdale LLP

(57) ABSTRACT

A method for multivariate analysis using a mathematical model for generating model data and actual data for more than one variable includes for each variable, determining a difference between the model data and the actual data. The model data is substantially representative of more than one variable. The method also includes for each variable, determining a fractional impact on performance. The method further includes for each variable, determining a weighted deviation based on the determined difference and the determined fractional impact. The method also includes transmitting the weighted deviation to an output device.

20 Claims, 5 Drawing Sheets

METHOD AND SYSTEM FOR DATA DECOMPOSITION VIA GRAPHICAL MULTIVARIATE ANALYSIS

BACKGROUND OF THE INVENTION

The field of this invention relates generally to engines, and more particularly to a method and system for use in monitoring engines via decomposition of data using a graphical multivariate analysis.

Generally, known engines include a plurality of known components that facilitate a plurality of known operational processes. During operation of an engine, a user typically monitors a selected number of engine processes by collecting data associated with parameters that are at least partially representative of the existing conditions of the components. Specifically, a user may monitor a plurality of operational parameters through raw data supplied directly to the user, or by processing at least a portion of the data collected and providing the results of such processing to the user. Some known processed data is generated from one parameter, while other processed data is derived from a plurality of parameters. Moreover, such raw and processed data may enable trending activities to be generated, such as a trend chart of the raw and processed data. Typically, such trend charts illustrate such data, whether raw or processed, versus time. Moreover, some known trend charts include a plurality of trend plots, wherein each trend plot is associated with one parameter.

At least one known method of monitoring the operation of an engine includes generating a plurality of such trend charts, and/or generating a plurality of data tables, and having a user attempt to determine the relative proportion of how each parameter is impacting the process. If more than one parameter or issue is adversely affecting any of the processes, assessing the extent of how each parameter impact the process may be time-consuming, difficult, and/or inaccurate. For example, it is possible that an anomaly embedded within the data may be identified that ultimately is not adversely impacting the parameters and processes being evaluated. In addition, for those trend charts that indicate a plurality of parameters, such parameters may be scaled such that an apparent disproportionate relationship between parameters that do not share a common unit of measurement may be insinuated.

BRIEF DESCRIPTION OF THE INVENTION

In one aspect, a method for multivariate analysis is provided. The method uses a mathematical model for generating model data and actual data for more than one variable. The model data is substantially representative of more than one variable. The method includes for each variable, determining a difference between the model data and the actual data. The method also includes for each variable, determining a fractional impact on performance. The method further includes for each variable, determining a weighted deviation based on the determined difference and the determined fractional impact. The method also includes transmitting the weighted deviation to an output device.

In another aspect, a monitoring system for use with a turbine engine is provided. The monitoring system includes at least one processor coupled in data communication with a plurality of measuring instruments. Each of the measuring instruments is associated with at least one of a plurality of variables and collects actual engine data. The system also includes a mathematical model at least partially resident within the at least one processor. The model is substantially representative of at least a portion of an engine process and is at least partially derived from at least one of the variables. The mathematical model stores model data. The system further includes at least one algorithm programmed within the at least one processor. The at least one algorithm is programmed to determine a fractional impact on engine performance for each variable. The at least one algorithm is also programmed to determine a difference between the model and the actual data. The at least one algorithm is further programmed to determine a weighted deviation based on the determined difference and the determined fractional impact. The system also includes at least one output device coupled in data communication with the at least one processor.

In a further aspect, a gas turbine engine is provided. The gas turbine engine includes at least one compressor and at least one turbine rotatably coupled to the at least one compressor. The engine also includes a monitoring system coupled in data communication with at least one of the at least one compressor and the at least one turbine. The monitoring system includes at least one processor coupled in data communication with a plurality of measuring instruments. Each of the measuring instruments is associated with at least one of a plurality of variables and collects actual engine data. The system also includes a mathematical model at least partially resident within the at least one processor. The model is substantially representative of at least a portion of an engine process and is at least partially derived from at least one of the variables. The mathematical model stores model data. The system further includes at least one algorithm programmed within the at least one processor. The at least one algorithm is programmed to determine a fractional impact on engine performance for each variable. The at least one algorithm is also programmed to determine a difference between the model and the actual data. The at least one algorithm is further programmed to determine a weighted deviation based on the determined difference and the determined fractional impact. The system also includes at least one output device coupled in data communication with the at least one processor.

DETAILED DESCRIPTION OF THE INVENTION

Utilizing graphical multivariate analysis techniques as described herein facilitates identifying associated parameters that may be driving certain process behaviors while also facilitating elimination of those parameters that are less likely to be driving such process behaviors. In an active operating environment, such short-term, or substantially real-time, determinations may facilitate early isolation of the initiating conditions and subsequent restoration of process parameters to desired ranges. Moreover, early elimination of apparently unaffected parameters facilitates focusing operation and maintenance resources toward higher probability causes. Furthermore, earlier determination of apparent causes of the transient facilitates actions by operating personnel to mitigate deleterious effects on the process and/or equipment by taking preemptive and/or corrective actions within a sort time frame after the transient initiates. Also, erroneous values of operational signals due to drift or failures of instrumentation may be manifested within a graphical display by an independent shift of one of the signals with no associated changes in other portion of the graphical display.

Figure 1:
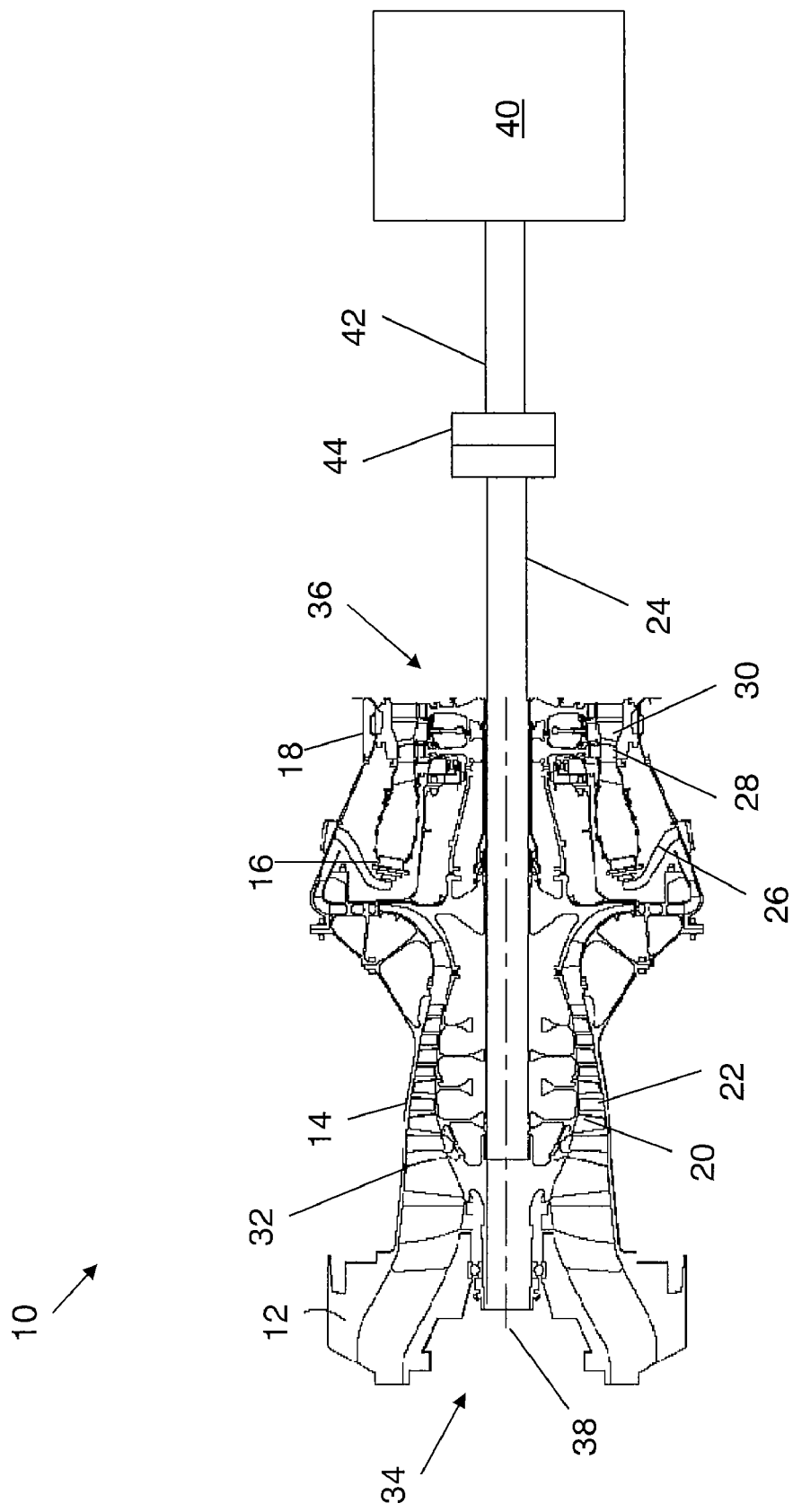
FIG. 1 is a cross-sectional schematic view of an exemplary gas turbine engine assembly.

FIG. 1 is a cross-sectional schematic view of a gas turbine engine assembly 10 that includes a core engine 12. Core engine 12 includes a compressor 14, a combustor 16, and a power turbine 18. Compressor 14 is coupled in flow communication with combustor 16, which in turn, is coupled in flow communication with power turbine 18. Compressor 14 includes a plurality of rotating blades 20 and stationary blades 22, wherein rotating blades 20 are coupled to an engine shaft 24. Combustor 16 is also coupled in flow communication with a source of fuel (not shown) via a fuel supply manifold 26. Turbine 18 includes a plurality of rotating blades 28 and stationary blades 30, wherein rotating blades 28 are coupled to engine shaft 24. Blades 20 and 28 extend radially outward from shaft 24 towards casing 32. Core engine 12 also includes a casing 32 that extends about compressor 14, combustor 16, and power turbine 18. Blades 20 and 28 extend radially outward from shaft 24 towards casing 32. Blades 22 and 30 are coupled to casing 32 and extend radially inward toward shaft 24. Core engine 12 further includes an air intake side 34 and a combustion exhaust side 36. Core engine 12 is substantially symmetrical about a centerline 38.

Engine assembly 10 also includes a power transmission device 40 that is coupled to power transmission drive shaft 42, wherein shaft 42 is coupled to engine shaft 24 via a coupling 44. In the exemplary embodiment, engine assembly 10 is a T64 model turboshaft engine commercially available from GE Aviation, Cincinnati, Ohio. Alternatively, engine assembly 10 is any engine including, but limited to, a gasoline engine, a diesel engine, a steam turbine engine, and any combustion turbine engine. Also, in the exemplary embodiment, device 40 is a main transmission for a propeller shaft (not shown) and is configurable to receive drive power from a plurality of shafts 42. Alternatively, device 40 is any device that facilitates operation of engine assembly 10 as described herein.

During operation, air is drawn into core engine 12 at air intake side 34 and is channeled through compressor 14 axially along centerline 38. The air is compressed and the compressed air is channeled to combustor 16, wherein the air is combusted with fuel channeled to combustor 16 via manifold 26, thereby generating combustion exhaust gases. The gases are channeled through turbine 18, wherein the gases transmit rotational power to shaft 24 and are subsequently channeled through and exhausted from core engine 12 via exhaust side 36. Shaft 24 drives compressor 14. Shaft 24 also drives shaft 42 via coupling 44, wherein shaft 42 drives transmission device 40.

Figure 2:
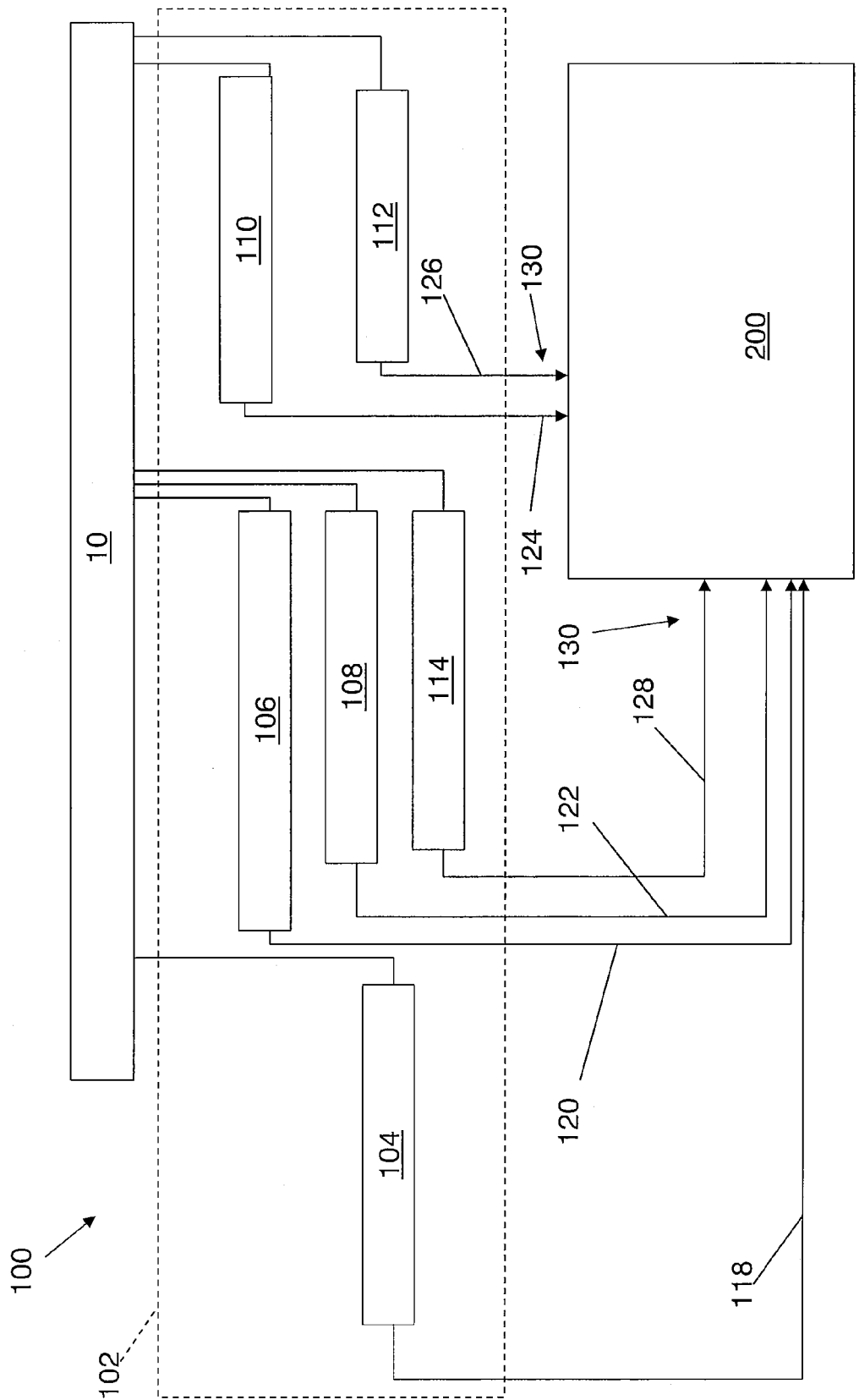
FIG. 2 is a schematic view of an exemplary monitoring system that may be used with the gas turbine engine shown in FIG. 1.

FIG. 2 is a schematic illustration of at least a portion of an exemplary monitoring system 100 that may be used to monitor a plurality of processes within gas turbine engine assembly 10 (shown in FIG. 1). In the exemplary embodiment, monitoring system 100 includes a plurality of measuring instruments 102 that are coupled to gas turbine engine assembly 10 that measure a plurality of predetermined operational parameters associated with engine assembly 10. Moreover, in the exemplary embodiment, such predetermined operational parameters include, but are not limited to, temperature, torque, humidity, fuel heating values, fuel flow, and turbine speed. Alternatively, system 100 includes instrumentation that enables measurements of any parameters that facilitate operation of engine assembly 10 as described herein.

Specifically, in the exemplary embodiment, instruments 102 include a temperature measuring instrument 104, a torque measuring instrument 106, a humidity measuring instrument 108, a lower heating value measuring instrument 110, a fuel flow measuring instrument 112, and a turbine speed measuring instrument 114. Moreover, each measuring instrument 102 generates at least one electronic or electrical signal that is representative of the operational process being measured. Also specifically, in the exemplary embodiment, each of instruments 104, 106, 108, 110, 112, and 114 generates a respective temperature, or $T_{Actual}$ signal 118, a torque, or $\tau_{Actual}$ signal 120, a humidity, or $H_{Actual}$ signal 122, a lower heating value, or $LHV_{Actual}$ signal 124, a fuel flow, or $F_{Actual}$ signal 126, and a turbine speed, or $S_{Actual}$ signal 128. Signals 118 through 128 are collectively referred to herein as operating signals 130 wherein T is temperature, $\tau$ is torque, H is humidity, LHV is lower heating value, F is fuel flow, and S is turbine speed.

In the exemplary embodiment, operating signals 130 are generated during operation of engine assembly 10 and are measured using a deterministic control and scanning scheme. For example, in one embodiment, the scan time of the scanning scheme is approximately one millisecond and operating signals 130 are time-stamped. In an alternative embodiment, operating signals 130 are measured using a non-deterministic control and scanning scheme. In another embodiment, the scan time of the scanning scheme may be any suitable elapsed time increment that enables monitoring system 100 to function as described herein.

System 100 also includes at least one processor 200. Each instrument 102 is coupled in data communication with processor 200, wherein processor 200 receives and uses signals 130 as described herein. Processor 200 processes signals 130 received from measuring instruments 102. As used herein, the term "processor" is not limited to just those integrated circuits referred to in the art as a processor, but broadly refers to at least one microcontroller, microcomputer, programmable logic controller (PLC), application-specific integrated circuit, and other programmable circuits, and these terms are used interchangeably herein. In the exemplary embodiment, processor 200 includes an electronic memory (not shown) that includes, but is not limited to, a computer-readable medium such as a random access member (RAM). Alternatively, a floppy disk, a compact disc-read only memory (CD-ROM), a magneto-optical disk (MOD), and/or a digital versatile disc (DVD) may also be used.

Figure 3:
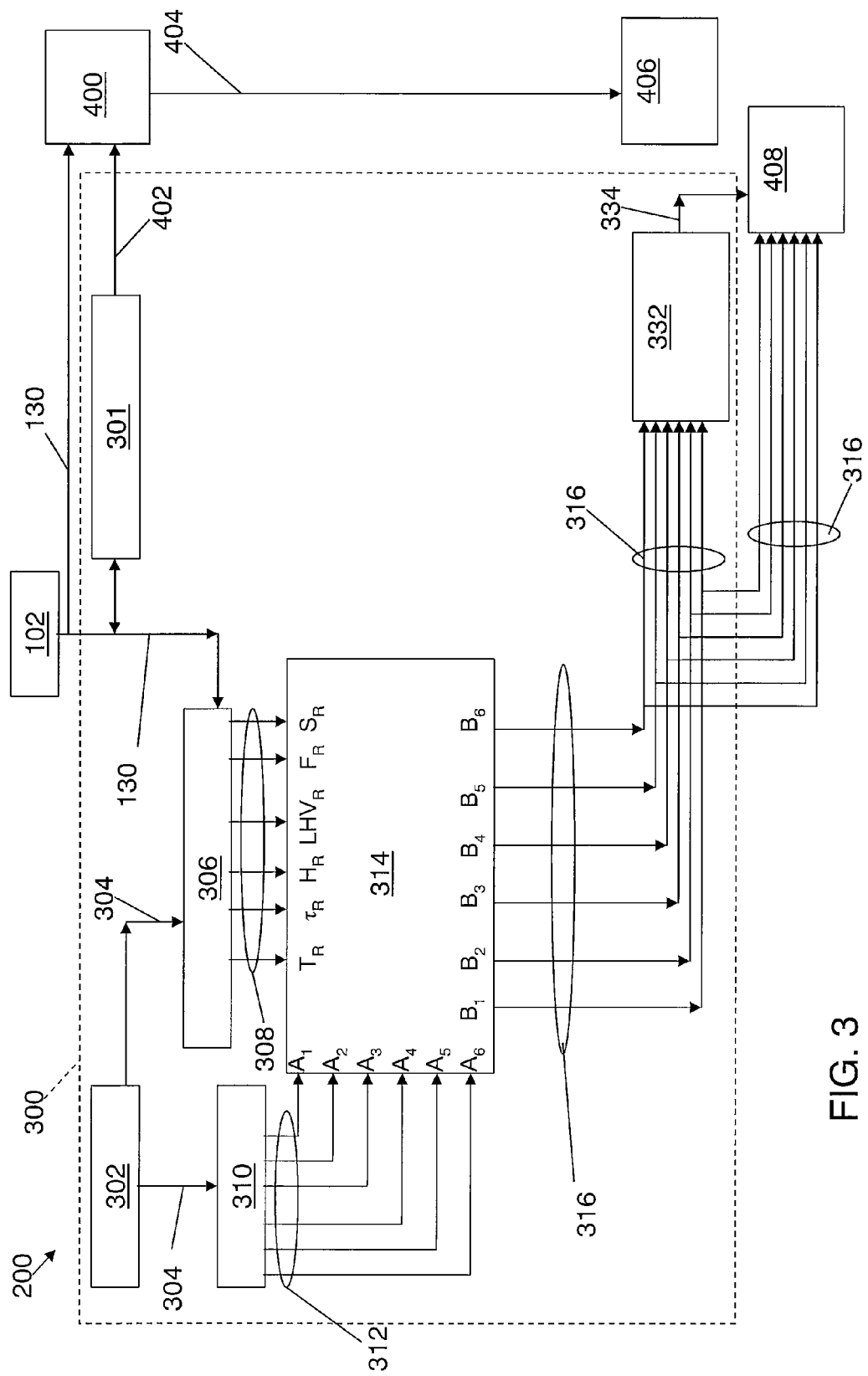
FIG. 3 is a block diagram of an exemplary logic module that may be used with the monitoring system shown in FIG. 2.

FIG. 3 is a block diagram of an exemplary logic module 300 that may be used with monitoring system 100 (shown in FIG. 2). Monitoring system 100 includes at least one logic module 300, and in the exemplary embodiment, logic module 300 is implemented within processor 200. Logic module 300 includes a data storage block 301 that is coupled in data communication with instruments 102. Data storage block 301 is receives and stores operating signals 130 transmitted from instruments 102 for later use, that is, other than immediate use, within monitoring system 100 as described herein.

Logic module 300 also includes a mathematical model function block 302. Mathematical model function block 302 includes at least one algorithm (not shown) that at least partially represents a mathematical model of a process. Such an algorithm, or algorithms, is/are herein referred to as a mathematical model (not shown). In the exemplary embodiment, the mathematical model is substantially representative of the real-world performance and behavior of at least a portion of at least one process associated with engine assembly 10 (shown in FIGS. 1 and 2), and is a function of a plurality of measured parameters. For example, in the exemplary embodiment, specific fuel consumption (SFC) is a function of a plurality of variables, or measured parameters including temperature, torque, humidity, lower heating value, fuel flow, and turbine speed. Alternatively, any process with any number of variables, or functional parameters is monitored as described herein.

As is known, SFC for a gas turbine engine with a mechanical shaft output, for example, a turboshaft engine, is substantially a measure of efficiency. Moreover, SFC measures a mass of fuel needed to provide a specific power output for a specific period of time. SFC is typically measured in units of kilograms per kilowatt-hours (kg/kW-h) (pounds-mass per horsepower-hour (lb/HP-h)), that is, kilograms (pounds) of fuel consumed for every kilowatt (horsepower) generated during one hour of operations. As engine efficiency increases, SFC decreases. Conversely, as engine efficiency decreases, SFC increases.

More specifically, the following expression, or algorithm is representative of specific fuel consumption:

$$SFC(T,\tau,H,LHV,F,S) \quad (1)$$

wherein T is temperature, $\tau$ is torque, H is humidity, LHV is lower heating value, F is fuel flow, and S is turbine speed. The variables associated with algorithm (1) are substantially similar to the respective parameters measured by instruments 102 and represented by signals 130. That is, each of the six measured parameters T, $\tau$, H, LHV, F, and S has a known proportionate effect on specific fuel consumption of engine assembly 10.

In the exemplary embodiment, the mathematical model implemented within function block 302 is static. Alternatively, the mathematical model implemented within function block 302 is dynamic. Moreover, in the exemplary embodiment, the mathematical model implemented within function block 302 is derived by backfitting data collected via instruments 102 over a predetermined period of time through a predetermined plurality of parameter transients within predetermined ranges. Backfitting as used herein is defined as generating mathematical expressions that substantially predict future results using collected data substantially representative of past results. Methods of backfitting include, but are not limited to, rigorous statistical analysis, standard regression analyses, and "trial and error" algorithm determinations.

Alternatively, the mathematical model implemented within function block 302 is derived by methods that include, but are not limited to, implementing the model within a neural network. Function block 302 generates and transmits a mathematical model signal 304 for use within logic module 300. Mathematical model signal 304 includes model data, or more specifically, values for each of temperature ($T_{Model}$), torque ($\tau_{Model}$), humidity ($H_{Model}$), lower heating value ($LHV_{Model}$), fuel flow ($F_{Model}$), and turbine speed ($S_{Model}$).

Logic module 300 also includes at least one comparator function block 306. Function block 306 is coupled in data communication with data storage block 301, function block 302 and instruments 102. Function block 306 receives at least one mathematical model signal 304 from function block 302 and operating signals 130 from instruments 102 and/or data storage block 301. Function block 306 uses at least one comparator algorithm (not shown) to facilitate comparing mathematical model signal 304 with each of operating signals 130. As such, function block 306 generates a plurality of residual value signals 308, that is, one signal for each of the six measured parameters per the following algorithms:

$$T_R = T_{Model} - T_{Actual} \quad (2)$$

$$\tau_R = \tau_{Model} - \tau_{Actual} \quad (3)$$

$$H_R = H_{Model} - H_{Actual} \quad (4)$$

$$LHV_R = LHV_{Model} - LHV_{Actual} \quad (5)$$

$$F_R = F_{Model} - F_{Actual} \quad (6)$$

$$S_R = S_{Model} - S_{Actual} \quad (7)$$

wherein each residual value signal generated by algorithms (2) through (7) above are substantially representative of a difference between the appropriate portions of mathematical model signal 304 and each of respective signals 118 through 128. Therefore, such differences as generated within signals 308 are representative of deviations between the substantially real world model of the process and actual measurements.

Function block 306 also sorts residual value signals 308 chronologically, that is, in time order of receipt. Each of residual value signals 308 is transmitted by block 306 for use within logic module 300 as described herein.

Logic module 300 also includes at least one differentiator function block 310 that is coupled in data communication with function block 302 and receives mathematical model signal 304 transmitted from function block 302. Function block 310 also uses at least one partial differentiation algorithm (shown below) to facilitate performing at least one partial differentiation, or decomposition operation on at least a portion of signal 304 and to generate a plurality of partially differentiated, or decomposed signals 312. Therefore, function block 310 effectively decomposes the mathematical model into its constituent variables, and signals 312 substantially represent decomposed portions of the mathematical model. Moreover, function block 310 transmits signals 312 for use within logic module 300 as described herein.

For example, in the exemplary embodiment, the following partial differentiation, or decomposition algorithms are used wherein SFC, T, $\tau$, H, LHV, F, and S are as defined above:

$$A_1 = (\delta SFC/\delta T) \quad (8)$$

$$A_2 = (\delta SFC/\delta \tau) \quad (9)$$

$$A_3 = (\delta SFC/\delta H) \quad (10)$$

$$A_4 = (\delta SFC/\delta LHV) \quad (11)$$

$$A_5 = (\delta SFC/\delta F) \quad (12)$$

$$A_6 = (\delta SFC/\delta S) \quad (13)$$

wherein $A_1$, $A_2$, $A_3$, $A_4$, $A_5$, and $A_6$ are each short-hand expressions that substantially represent predetermined weighted values for each of the six variables relied upon in determining SFC as defined in algorithm (1). That is, algorithms (8) through (13) are mathematical representations of a fractional impact of how much each variable affects the overall process. Therefore, as used herein, decomposition is defined as determining the fractional impact of how much each variable affects the overall process.

Specifically, $A_1$ is substantially representative of a weighted effect that the T variable has on SFC. Also, specifically, $A_2$ is substantially representative of a weighted effect that the $\tau$ variable has on SFC. Further, specifically, $A_3$ is substantially representative of a weighted effect that the H variable has on SFC. Moreover, specifically, $A_4$ is substantially representative of a weighted effect that the LHV variable has on SFC. Also, specifically, $A_5$ is substantially representative of a weighted effect that the F variable has on SFC. Further, specifically, $A_6$ is substantially representative of a weighted effect that the S variable has on SFC. As such, algorithms (8) through (13) implemented within function block 310 generate partially differentiated signals 312 for each measured parameter. In the exemplary embodiment, algorithms (8) through (13) are statically resident within function block 310. Alternatively, algorithms (8) through (13) are dynamically resident within function block 310.

Logic module 300 also includes a change determination function block 314. Function block 314 is coupled in data communication with function blocks 306 and 310 and receives signals 308 and signals 312 from function blocks 306 and 310, respectively. Function block 314 uses at least one change determination algorithm (below) to facilitate generating a set of signals proportional to both the associated residual values and their relative effect on SFC. Specifically, function block 314 uses at least one multiplication algorithm (shown below) to determine a plurality of values representative of the associated weighted effects of the deviations of actual measurements from the model and generate a plurality of weighted deviation signals 316. Moreover, function block 314 transmits signals 316 for use within logic module 300 as described herein. At least a portion of the decomposition of the mathematical model performed within function block 310 is transmitted within signals 316.

For example, in the exemplary embodiment, the following multiplication algorithms are used wherein $T_R$, $\tau_R$, $H_R$, $LHV_R$, $F_R$, $S_R$, and $A_1$ through $A_6$ are as defined above:

$$B_1 = A_1 * T_R \quad (14)$$

$$B_2 = A_2 * \tau_R \quad (15)$$

$$B_3 = A_3 * H_R \quad (16)$$

$$B_4 = A_4 * LHV_R \quad (17)$$

$$B_5 = A_5 * F_R \quad (18)$$

$$B_6 = A_6 * S_R \quad (19)$$

wherein $B_1$ through $B_6$ substantially represent the plurality of values representative of the associated weighted effects of the deviations of actual measurements from the model. Therefore, weighted effect signals 316 are substantially representative of SFC effectively decomposed into the six associated parameters as described herein.

Specifically, $B_1$ substantially represents the proportional, or weighted, effect a change in temperature would have, or is having, upon SFC. Also, specifically, $B_2$ substantially represents the proportional, or weighted, effect a change in torque would have, or is having, upon SFC. Further, specifically, $B_3$ substantially represents the proportional, or weighted, effect a change in humidity would have, or is having, upon SFC. Also, specifically, $B_4$ substantially represents the proportional, or weighted, effect a change in lower heating value would have, or is having, upon SFC. Further, specifically, $B_5$ substantially represents the proportional, or weighted, effect a change in fuel flow would have, or is having, upon SFC. Also, specifically, $B_6$ substantially represents the proportional, or weighted, effect a change in turbine speed would have, or is having, upon SFC.

Logic module 300 also includes a summation function block 332 that is coupled in electronic communication with function block 314 and that receives signals 316 transmitted from function block 314. Moreover, function block 332 sums each of associated signals 316 representing $D_1$ through $D_6$ using the following algorithm:

$$\Delta SFC = B_1 + B_2 + B_3 + B_4 + B_5 + B_6 \quad (20)$$

wherein $\Delta SFC$ is substantially representative of the overall change in SFC as a result of the sum of the each individual change associated with each of the six parameters. Function block 332 generates and transmits a summation signal 334 that is used within monitoring system 100.

Monitoring system 100 also includes a calculated SFC determination function block 400 implemented within processor 200. Function block 400 receives operational signals 130 from instruments 102, as well as a plurality of historical data signals 402 from data storage block 301. Signals 402 include historical signals associated with the six variables, or parameters that affect SFC, that is, temperature, torque, humidity, lower heating value, fuel flow, and turbine speed. An algorithm substantially similar to algorithm (1) is implemented within function block 400 to determine a plurality of SFC values as a function of time. A SFC signal 404 that is substantially representative of the calculated SFC values is generated and transmitted. Signal 404 is transmitted to a first output device 406.

An exemplary method of multivariate analysis using a mathematical model for generating model data and actual data for more than one variable includes for each variable, determining a difference between the model data and the actual data. The model data is substantially representative of more than one variable. The method also includes for each variable, determining a fractional impact on performance. The method further includes for each variable, determining a weighted deviation based on the determined difference and the determined fractional impact. The method also includes transmitting the weighted deviation to output device 406 and/or 408.

Figure 4:
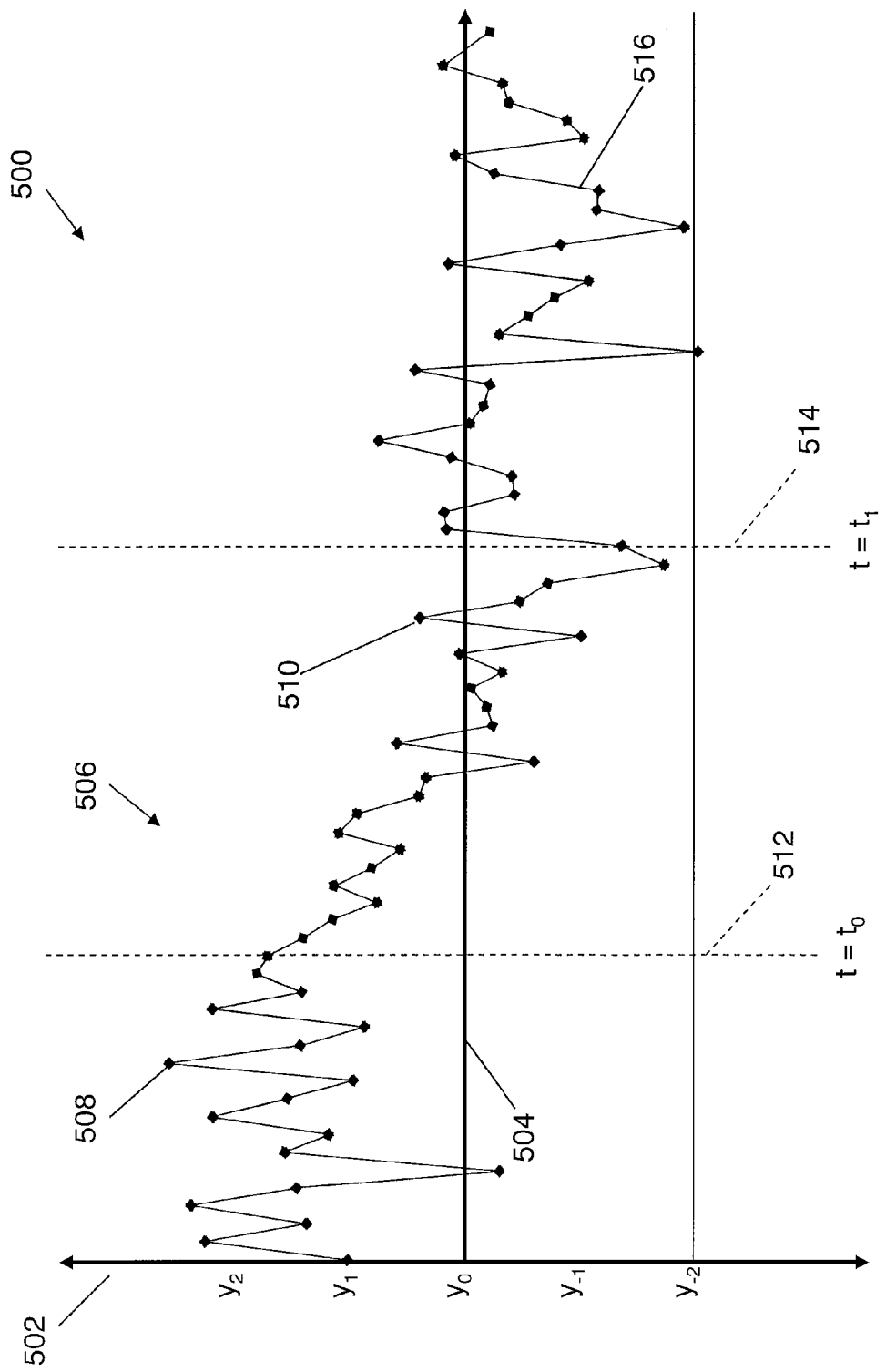
FIG. 4 is a graphical view of an exemplary output generated by the monitoring system shown in FIG. 2.

FIG. 4 is a graphical view 500 of an exemplary output generated by monitoring system 100 (shown in FIG. 2). Specifically, graphical view 500 is substantially representative of a signal 404 generated by monitoring system 100, or more specifically, by calculated SFC determination function block 400 (shown in FIG. 3). Graph 500 includes an ordinate (y-axis) 502 that is substantially representative of SFC as described herein. In the exemplary embodiment, y-axis 502 is graduated in units of kg/kW-h (lb/HP-h). Such graduations include a plurality of substantially identical increments with $y_0$ as a centralized measurement and $y_1$ and $y_2$ as positive increments above $y_0$ and $y_{-1}$ and $y_{-2}$ as negative increments below $y_0$. Alternatively, y-axis 502 has any units that facilitates operation of monitoring system 100 as described herein including, not being limited to, unitless graduations and specialized indexed graduations. In the exemplary embodiment, $y_0$ is a predetermined value of SFC representative of a predetermined efficiency of engine assembly 10 (shown in FIGS. 1 and 2).

Graph 500 also includes an abscissa (x-axis) 504 that is substantially representative of time with appropriate temporal units. Graph 500 further includes an SFC curve 506 that substantially represents a behavior of SFC as a function of time coincident with signal 404 generated and transmitted by function block 400 (both shown in FIG. 3).

Curve 506 includes a first portion 508 that substantially represents values of SFC typically expected during operation of engine assembly 10 (shown in FIG. 1). Consistent with the correlation between SFC and engine efficiency as described above, portion 508 indicates engine assembly 10 operating with an SFC above $y_0$ that is also rep efficiency of engine assembly 10 representative of an efficiency below that associated with $y_0$. That is, all components of engine assembly 10 for a given power output of engine assembly 10, including instruments 102, are operating substantially within expected operational parameters for such given power output of engine assembly 10 with such operating efficiency.

Curve 506 also includes a second portion 510 that substantially represents values of SFC during a change in at least one of the measured parameters, wherein the change in the at least one measured parameter manifests itself as a change in SFC starting at after a time $t_0$ as indicated by a first distinguishing temporal line 512. The transient ends at a time $t_1$ as indicated by a second distinguishing temporal line 514. During this transient, the efficiency of engine assembly 10 improves as SFC decreases.

Curve 506 further includes a third portion 516 that substantially represents values of SFC after the change in at least one of the measured parameters, wherein the change in the at least one measured parameter manifests itself as a semi-permanent decrease in SFC and a semi-permanent increase in the efficiency of engine assembly 10 after time $t_1$.

Referring again to FIG. 3, monitoring system 100 also includes a second output device 408 that receives weighted effect signals 316 and summation signals 334 from function blocks 314 and 332, respectively. First output device 406 and second output device 408 may be the same device. Device 408 displays a summation graphical image (not shown in FIG. 3) that is substantially representative of summation signal 334. Device 408 also displays a multivariate graphical image (not shown in FIG. 3) wherein each of the plurality of decomposed signals, or weighted effect signals 316, is displayed in temporal relation to the summation signal graphical image.

Figure 5:
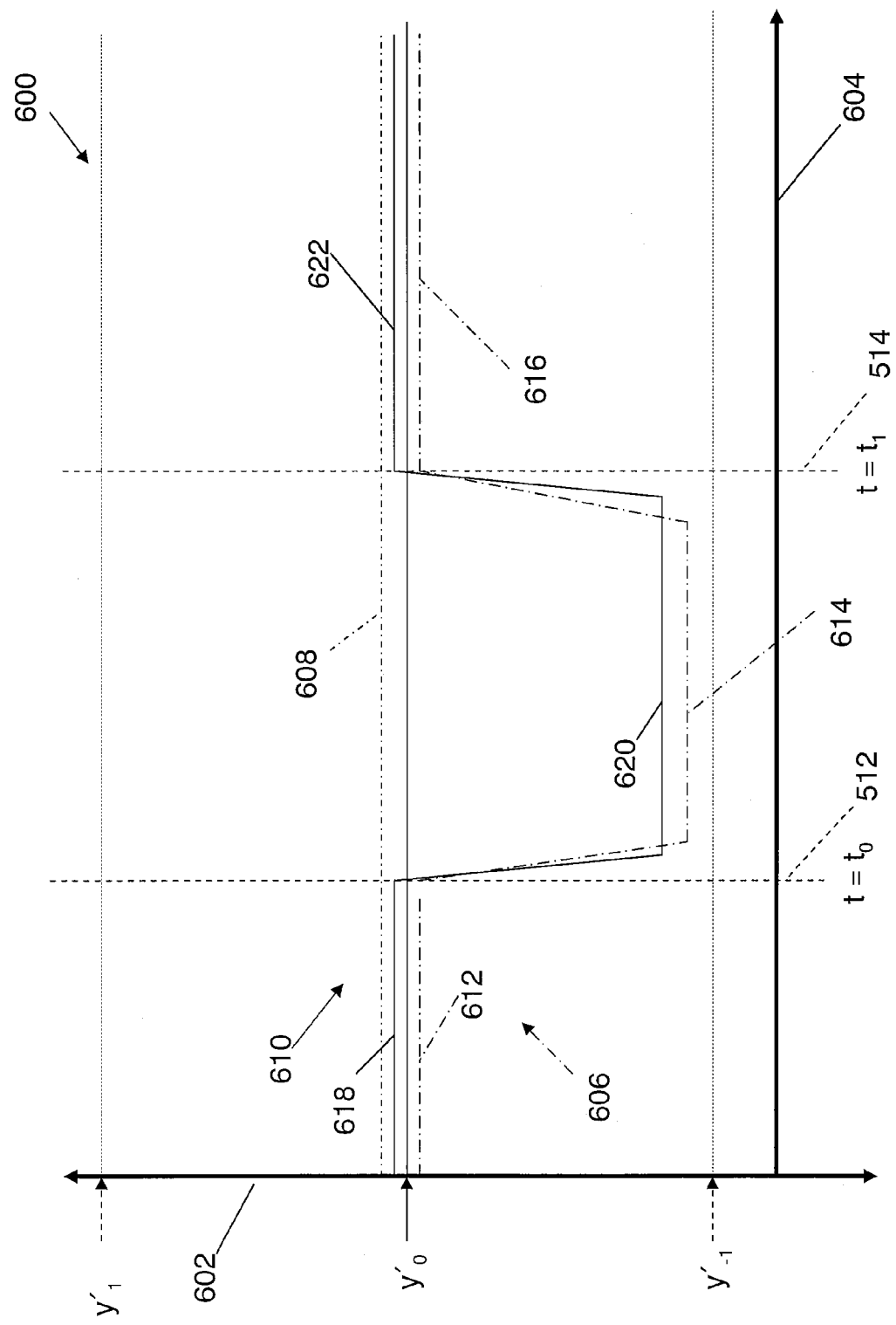
FIG. 5 is a graphical view of an exemplary output generated by the logic module shown in FIG. 3.

FIG. 5 is a graphical view 600 of an exemplary output generated by logic module 300 (shown in FIG. 3). Specifically, graphical view 600 is substantially representative of signal 334 and a portion of signals 316 generated by logic module 300 (all shown in FIG. 3). More specifically, graphical view 600 is substantially representative of a change in SFC and the associated six parameters described above, that is, T, τ, H, LHV, F, and S, with respect to time.

Graph 600 includes an ordinate (y-axis) 602 that includes unitless graduations having a substantially identical increments with $y'_0$ as a centralized measurement, $y'_1$ as a positive increment above $y_0$, and $y'_{-1}$ as a negative increment below $y'_0$. Alternatively, y-axis 602 has any units that facilitate operation of monitoring system 100 as described herein including, not being limited to, specialized indexed graduations as well as units of SFC and the six associated parameters per unit time. In the exemplary embodiment, $y'_0$ is zero, thereby representing a zero rate of change of SFC and the six associated parameters.

In addition, graphical view 600 includes a plurality of curves substantially representative of a plurality of signals that include a rate of change of SFC and two decomposed parameter signals. Specifically, graphical view 600 includes a ΔSFC curve 606 that is substantially representative of summation signal 334, as generated by function block 332 (both shown in FIG. 3). Also, view 600 includes first and second decomposed parameter curves 608 and 610, respectively, that substantially represent two of the six weighted deviation signals 316. In general, graphical view 600 facilitates substantially associating a first decomposed signal with at least a portion of the summation signal graphical image; that is ΔSFC curve 606 and substantially excluding a second decomposed signal from association with at least a portion of ΔSFC curve 606.

ΔSFC curve 606 includes a first portion 612 that substantially represents a zero value for ΔSFC. Portion 612 is indicative of an overall rate of change, or slope, of portion 508 (shown in FIG. 4), wherein the smaller changes in SFC curve 506 (shown in FIG. 4) are not shown in curve 606. In the exemplary embodiment, such smaller changes generally are a result of minute changes in one of the six associated parameters and electronic noise within monitoring system 100. Such minute changes in SFC and system noise are mitigated via filters and/or smoothing functions (neither shown) programmed within processor 200. FIG. 5 shows portion 612 slightly below the $y'_0$ graduation for illustrative clarity.

ΔSFC curve 606 also includes a second portion 614 that substantially represents a negative value for ΔSFC. Specifically, second portion 614 illustrates a negative slope associated with second portion 510 (shown in FIG. 4) starting at time $t_0$ as indicated by first distinguishing temporal line 512 and ending at time $t_1$ as indicated by second distinguishing temporal line 514. Portion 614 is smoothed via filtering and noise mitigation in a manner substantially similar to that of portion 612.

ΔSFC curve 606 further includes a third portion 616 that substantially represents a zero value for ΔSFC after time $t_1$ as indicated by second distinguishing temporal line 514. Portion 616 is smoothed via filtering and noise mitigation in a manner substantially similar to that of portion 612. Also, FIG. 5 shows portion 616 offset from the $y'_0$ graduation for illustrative clarity.

First decomposed parameter curve 608 is substantially constant throughout the SFC transient as illustrated via curve 506 initiating at time $t_0$, or line 512. An apparent lack of a change in the first parameter represented by first parameter curve 608 throughout the transient facilitates eliminating the first parameter from being a significant cause of the transient. FIG. 5 shows curve 608 slightly above the $y'_0$ graduation for illustrative clarity.

Second decomposed parameter curve 610 illustrates a transient of the associated second parameter. Curve 610 indicates a substantial change in behavior of the second parameter initiating at time $t_0$, or line 512. An apparent coincident change in behavior at line 512 of curves 506, 606, and 610 facilitates implicating the second parameter as being a leading driver of the transient.

Curve 610 includes a first portion 618 that substantially represents a zero value for the rate of change, or slope, of the second decomposed parameter. Portion 618 is smoothed via filtering and noise mitigation in a manner substantially similar to that of portion 612. FIG. 5 shows portion 618 slightly above the $y'_0$ graduation for illustrative clarity.

Curve 610 also includes a second portion 620 that substantially represents a negative value for the second decomposed parameter. Specifically, second portion 620 illustrates a negative slope associated with the second decomposed parameter starting at time $t_0$ as indicated by first distinguishing temporal line 512 and ending at time $t_1$ as indicated by second distinguishing temporal line 514. Portion 620 is smoothed via filtering and noise mitigation in a manner substantially similar to that of portion 612.

Curve 610 further includes a third portion 622 that substantially represents a zero value for the second decomposed parameter after time $t_1$ as indicated by second distinguishing temporal line 514. Portion 622 is smoothed via filtering and noise mitigation in a manner substantially similar to that of portion 612. Also, FIG. 5 shows portion 622 offset from the $y'_0$ graduation for illustrative clarity.

At least one known method of monitoring the operation of an engine includes generating a plurality of trend charts, and/or generating a plurality of data tables, and having a user attempt to determine the relative proportion of how each parameter is impacting the process. If more than one parameter or issue is adversely affecting any of the processes, assessing the extent of how each parameter impact the process may be time-consuming, difficult, and/or inaccurate. For example, it is possible that resources may be expended on analyzing an anomaly embedded within associated operational data, wherein such anomaly may ultimately be determined to not adversely impact the parameters and processes being evaluated. In addition, for those trend charts that indicate a plurality of parameters, such parameters may be scaled such that an apparent disproportionate relationship between parameters that do not share a common unit of measurement may be insinuated.

Utilizing graphical multivariate analysis techniques as described herein facilitates identifying associated parameters that may be driving certain process behaviors while also facilitating elimination of those parameters that are less likely to be driving such process behaviors. In an active operating environment, such short-term, or substantially real-time, determinations may facilitate early isolation of the initiating conditions and subsequent restoration of process parameters to desired ranges. Moreover, early elimination of apparently unaffected parameters facilitates focusing operation and maintenance resources toward higher probability causes. Furthermore, earlier determination of apparent causes of the transient facilitates actions by operating personnel to mitigate deleterious effects on the process and/or equipment by taking preemptive and/or corrective actions within a sort time frame after the transient initiates. Also, erroneous values of operational signals 130 due to drift or failures of instrumentation 102 may be manifested within graph 600 by an independent shift of one of signals 316 with no associated change in SFC curve 506.

The methods and apparatus as described herein facilitate monitoring engines using graphical multivariate analysis. Specifically, the monitoring system as described above facilitates efficient and effective identification of performance deviations associated with predetermined processes and engine components. More specifically, the above-described monitoring system provides a method to evaluate a trend chart by decomposing such trend chart. Therefore, the monitoring system improves the ability of a user to identify an anomaly on the trend chart, and identify whether or not the anomaly is effecting the overall operation of the engine.

Exemplary embodiments of engine monitoring systems are described above in detail. The methods, apparatus and systems are not limited to the specific embodiments described herein nor to the specific illustrated engine monitoring systems.

While the invention has been described in terms of various specific embodiments, those skilled in the art will recognize that the invention can be practiced with modification within the spirit and scope of the claims.

What is claimed is:

1. A method for multivariate analysis using a mathematical model for generating model data and actual data for more than one variable, wherein the model data is substantially representative of more than one variable, said method comprising:
for each variable, determining a difference between the model data stored in a logic module of a machinery monitoring system and the actual data received from machinery being analyzed;
for each variable, determining by the logic module a factional impact on performance;
for each variable, determining by the logic module a weighted deviation based on the determined difference and the determined factional impact; and
transmitting the weighted deviation to an output device.

2. A method in accordance with claim 1 wherein determining a difference between the model data and the actual data comprises:
for each variable, collecting operational data that is substantially representative of performance; and
for each variable, determining residuals that are substantially representative of a difference between at least a portion of the operational data and at least a portion of the model data.

3. A method in accordance with claim 1 wherein determining a factional impact on performance comprises decomposing at least a portion of the mathematical model.

4. A method in accordance with claim 3 wherein decomposing at least a portion of the mathematical model comprises determining the fractional impact of each variable by executing a partial differential operation on the mathematical model.

5. A method in accordance with claim 1 wherein determining a weighted deviation based on the determined difference and the determined factional impact comprises, for each variable, multiplying the determined difference by the determined fractional impact.

6. A method in accordance with claim 1 wherein transmitting the weighted deviation to an output device comprises:
summing the weighted deviations and displaying a summation graphical image; and
displaying a multivariate graphical image of each of the weighted deviations in temporal relation to the summation graphical image, thereby facilitating graphical multivariate analysis.

7. A method in accordance with claim 6 wherein displaying a multivariate graphical image comprises at least one of:
associating a first weighted deviation with at least a portion of the summation graphical image; and
substantially excluding a second weighted deviation from association with at least a portion of the summation graphical image.

8. A method in accordance with claim 1 further comprising programming the mathematical model comprising one of:
storing a plurality of static algorithms;
storing a plurality of dynamic algorithms that are modified by at least one predetermined operational condition; and
backfitting operational data.

9. A monitoring system for use with a turbine engine comprising:
at least one processor coupled in data communication with a plurality of measuring instruments, wherein each of said measuring instruments is associated with at least one of a plurality of variables and collects actual engine data;
a mathematical model at least partially resident within said at least one processor, wherein said model is substantially representative of at least a portion of an engine process and is at least partially derived from at least one of the variables, wherein the mathematical model stores model data;
at least one algorithm programmed within said at least one processor, wherein the at least one algorithm is programmed to:
determine a fractional impact on engine performance for each variable;
determine a difference between said model and the actual data; and
determine a weighted deviation based on the determined difference and the determined fractional impact; and
at least one output device coupled in data communication with said at least one processor.

10. A monitoring system in accordance with claim 9 wherein the mathematical model is one of
a plurality of algorithms statically stored within said at least one processor; and
a plurality of algorithms stored within said at least one processor programmed to be dynamically modified by at least one predetermined operational condition.

11. A monitoring system in accordance with claim 9 wherein the at least one algorithm is further programmed to decompose at least a portion of said mathematical model with a least one partial differential operation, thereby facilitating determination of a fractional impact on engine performance for each variable.

12. A monitoring system in accordance with claim 11 wherein the at least one algorithm is further programmed to generate a residual for each variable, wherein each residual is substantially representative of a difference between a portion of the model data and the actual data.

13. A monitoring system in accordance with claim 12 wherein the at least one algorithm is further programmed to determine the weighted deviation for each variable by multiplying the fractional impact for each variable by the residual for each variable.

14. A monitoring system in accordance with claim 13 wherein the at least one algorithm is further programmed to sum the weighted deviations.

15. A gas turbine engine comprising:
at least one compressor;
at least one turbine rotatably coupled to said at least one compressor; and
a monitoring system coupled in data communication with at least one of said at least one compressor and said at least one turbine, said monitoring system comprising:
at least one processor coupled in data communication with a plurality of measuring instruments, wherein each of said measuring instruments is associated with at least one of a plurality of variables and collects actual engine data;
a mathematical model at least partially resident within said at least one processor, wherein said model is substantially representative of at least a portion of an engine process and is at least partially derived from at least one of the variables, wherein the mathematical model stores model data;
at least one algorithm programmed within said at least one processor, wherein the at least one algorithm is programmed to:
determine a fractional impact on engine performance for each variable;
determine a difference between said model and the actual data; and
determine a weighted deviation based on the determined difference and the determined fractional impact; and
at least one output device coupled in data communication with said at least one processor.

16. A gas turbine engine in accordance with claim 15 wherein the mathematical model is one of:
a plurality of algorithms statically stored within said at least one processor; and
a plurality of algorithms stored within said at least one processor programmed to be dynamically modified by at least one predetermined operational condition.

17. A gas turbine engine in accordance with claim 15 wherein the at least one algorithm is further programmed to decompose at least a portion of said mathematical model with a least one partial differential operation, thereby facilitating determination of a fractional impact on engine performance for each variable.

18. A gas turbine engine in accordance with claim 17 wherein the at least one algorithm is further programmed to generate a residual for each variable, wherein each residual is substantially representative of a difference between a portion of the model data and the actual data.

19. A gas turbine engine in accordance with claim 18 wherein the at least one algorithm is further programmed to determine the weighted deviation for each variable by multiplying the fractional impact for each variable by the residual for each variable.

20. A gas turbine engine in accordance with claim 19 wherein the at least one algorithm is further programmed to determine the weighted deviation for each variable by multiplying the fractional impact for each variable by the residual for each variable.

* * * * *